US008713331B2

(12) United States Patent
Kitagawa

(10) Patent No.: US 8,713,331 B2
(45) Date of Patent: Apr. 29, 2014

(54) SEMICONDUCTOR DEVICE INCLUDING A CLOCK GENERATING CIRCUIT FOR GENERATING AN INTERNAL SIGNAL HAVING A COARSE DELAY LINE, A FINE DELAY LINE AND A SELECTOR CIRCUIT

(76) Inventor: Katsuhiro Kitagawa, Tokyo (JP)

(*) Notice: Subject to any disclaimer, the term of this patent is extended or adjusted under 35 U.S.C. 154(b) by 549 days.

(21) Appl. No.: 12/724,011

(22) Filed: Mar. 15, 2010

(65) Prior Publication Data

US 2010/0231275 A1    Sep. 16, 2010

(30) Foreign Application Priority Data

Mar. 16, 2009  (JP) ................................. 2009-062882

(51) Int. Cl.
*H03K 5/04* (2006.01)
*G06F 1/00* (2006.01)

(52) U.S. Cl.
USPC ............ 713/300; 327/175; 327/163; 327/158

(58) Field of Classification Search
USPC ............. 713/300, 322, 501; 365/233.17, 198;
327/158, 175, 396; 326/30
See application file for complete search history.

(56) References Cited

U.S. PATENT DOCUMENTS

| 6,570,815 | B2 * | 5/2003 | Kashiwazaki ........... 365/233.17 |
| 7,092,299 | B2 * | 8/2006 | Kwak et al. .................... 365/198 |
| 7,288,959 | B1 * | 10/2007 | Lee ................................. 326/30 |
| 7,372,294 | B2 * | 5/2008 | Kim ................................. 326/30 |
| RE40,473 | E * | 8/2008 | Osborn et al. ................. 713/300 |
| 7,486,104 | B2 * | 2/2009 | Oh et al. .......................... 326/30 |
| 7,612,579 | B2 | 11/2009 | Fujisawa |
| 7,696,776 | B2 * | 4/2010 | Park ................................. 326/30 |
| 7,827,431 | B2 * | 11/2010 | Fujimoto ....................... 713/501 |
| 2004/0008064 | A1 * | 1/2004 | Kashiwazaki ................. 327/158 |
| 2006/0149984 | A1 * | 7/2006 | Yasumoto ...................... 713/322 |
| 2006/0158216 | A1 * | 7/2006 | Aoyama et al. ................. 326/30 |
| 2007/0279113 | A1 * | 12/2007 | Maeda et al. .................. 327/158 |
| 2008/0100335 | A1 * | 5/2008 | Choi et al. ....................... 326/30 |
| 2008/0218227 | A1 | 9/2008 | Maeda |
| 2009/0153185 | A1 * | 6/2009 | Oh et al. .......................... 326/30 |

FOREIGN PATENT DOCUMENTS

| JP | 2008-060641 A | 3/2008 |
| JP | 2008-217947 A | 9/2008 |

* cited by examiner

*Primary Examiner* — Thomas Lee
*Assistant Examiner* — Aurel Prifti
(74) *Attorney, Agent, or Firm* — Sughrue Mion, PLLC

(57) ABSTRACT

A semiconductor device includes a data input/output circuit that has an ODT function and a DLL circuit that generates an internal clock for determining an operation timing of the data input/output circuit. The DLL circuit has a first mode for controlling a phase of the internal clock in a precise manner and a second mode for operating with low power consumption. When the data input/output circuit does not perform an ODT operation, the DLL circuit operates in the first mode, and when the data input/output circuit performs the ODT operation, the DLL circuit operates in the second mode. In this manner, the operation mode of the DLL circuit is switched over depending on the ODT operation, so that the power consumption in the CDT operation in which strict phase control is not required can be reduced.

3 Claims, 8 Drawing Sheets

SEMICONDUCTOR DEVICE INCLUDING A CLOCK GENERATING CIRCUIT FOR GENERATING AN INTERNAL SIGNAL HAVING A COARSE DELAY LINE, A FINE DELAY LINE AND A SELECTOR CIRCUIT

BACKGROUND OF THE INVENTION

1. Field of the Invention

The present invention relates to a semiconductor device, and more particularly relates to a semiconductor device including a clock generating circuit, such as a DLL (Delay Locked Loop) circuit, that generates an internal clock.

2. Description of Related Art

In recent years, a synchronous memory device that performs an operation in synchronization with a clock has been widely used as a main memory for a personal computer or the like. In particular, in a synchronous memory device of DDR (Double Data Rate) type among various types of synchronous memories, a DLL circuit that generates an internal clock synchronized with an external clock is an essential component because it is necessary to synchronize input/output data with the external clock in a precise manner (see Japanese Patent Application Laid-open No. 2008-217947). Therefore, at least at the time of a read operation, the phase of the internal clock is strictly controlled by the DLL circuit.

However, power consumption of the DLL circuit increases as the phase control of an internal clock becomes more precise. Therefore, in the case that stricter phase control is required, it can cause a problem that the power consumption by the DLL circuit increases by the same level.

Meanwhile, because the internal clock generated by the DLL circuit is used for defining an output timing of read data, it is safe to say that generation of the internal clock is not necessary in a period other than the time of a read operation. However, once the DLL circuit is suspended, it takes a relatively long time until an internal clock that is precisely phase-controlled is generated after the DLL circuit is reactivated. Therefore, it is not realistic to suspend the DLL circuit every time the read operation is finished.

Furthermore, there are some semiconductor devices including a so-called ODT (On Die Termination) function (see Japanese Patent Application Laid-open No. 2008-060641). The ODT function is a function for using a data input/output terminal provided in a semiconductor device as a terminating resistor. Using the ODT function, it is possible to prevent a degradation of signal quality due to a reflection of the signal at the end of a transmission line, without mounting a terminating resistor on a mounting board. In a semiconductor device having the ODT function, an ODT operation is performed in synchronization with an internal clock, and therefore the DLL circuit is required to operate also at the time of the ODT operation.

However, the operation margin of the data input/output circuit with respect to the external clock is larger at the time of the ODT operation than at the time of the read operation. In other words, while tolerance of mismatch is relatively small in the phases of the read data and the external clock, the tolerance is relatively large in the phases of the operation timing of the ODT circuit and the external clock. This means that the operation timing of the ODT circuit does not require control as strict as that for the output timing of read data, which is also defined in the specifications. The present inventor focused his attention on this point, and performed a thorough examination to reduce the power consumption of the DLL circuit.

The problem described above is not only a problem in a synchronous memory device that includes a DLL circuit but also a common problem to all semiconductor devices that include other types of clock generating circuits.

SUMMARY

In one embodiment, there is provided a semiconductor device comprising: a data input/output terminal; a data input/output circuit that is connected to the data input/output terminal, and has an ODT function; and a clock generating circuit that generates an internal clock for determining an operation timing of the data input/output circuit, wherein the clock generating circuit has a first mode for controlling a phase of the internal clock in a precise manner and a second mode for operating with low power consumption, when the data input/output circuit does not perform an ODT operation, the clock generating circuit operates in the first mode, and when the data input/output circuit performs the ODT operation, the clock generating circuit operates in the second mode.

According to the present invention, because the operation mode of the clock generating circuit is switched depending on a status of the ODT operation, it is possible to reduce the power consumption at the time of the ODT operation that does not require strict phase control.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Preferred embodiments of the present invention will now be explained in detail with reference to the drawings.

Figure 1:
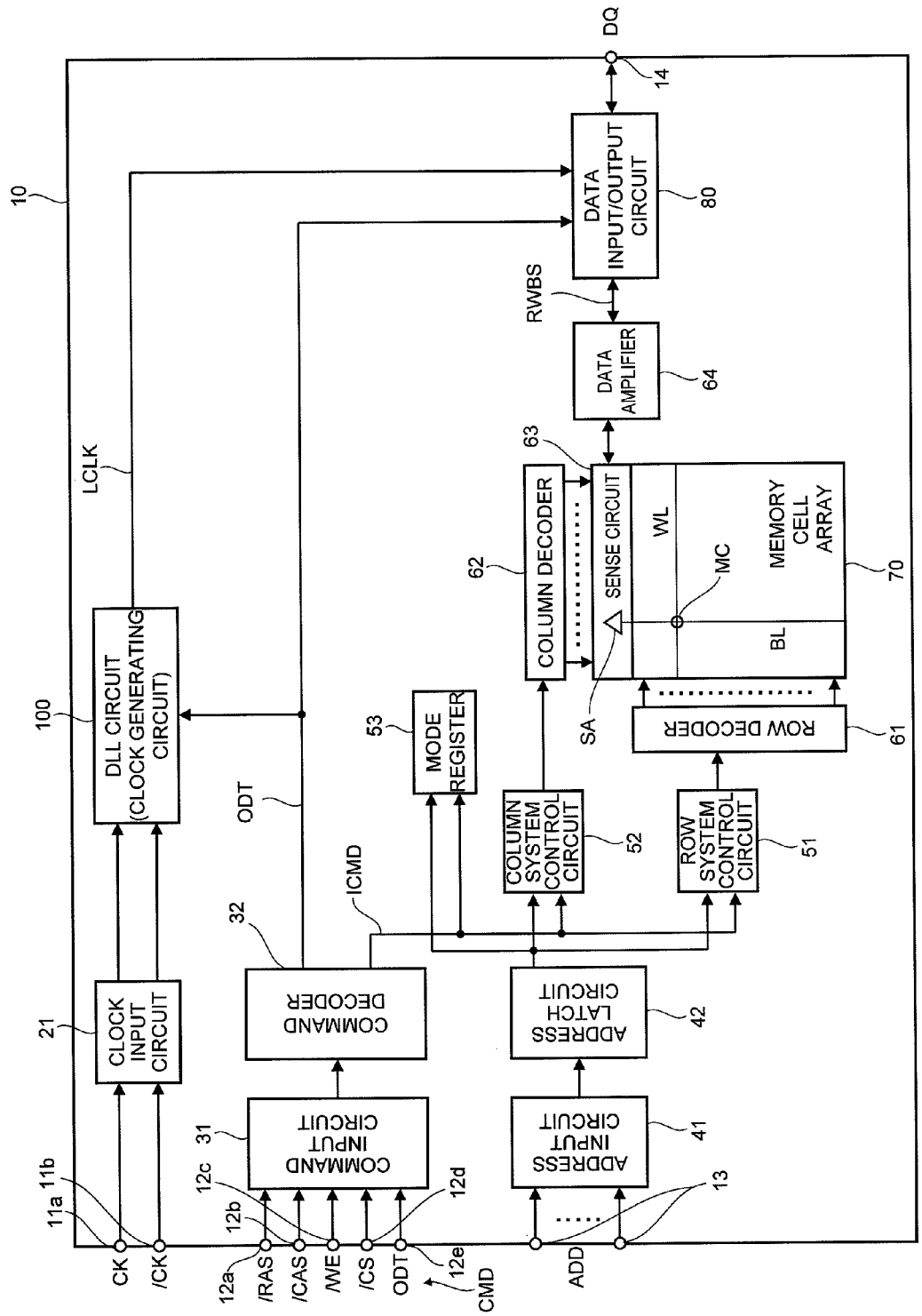
FIG. 1 is a block diagram of a semiconductor device 10 according to a first preferred embodiment of the present invention.

FIG. 1 is a block diagram of a semiconductor device 10 according to a first embodiment of the present invention.

The semiconductor device 10 according to the first embodiment is a synchronous type DRAM (Dynamic Random Access Memory), which includes, as external terminals, clock terminals 11a and 11b, command terminals 12a to 12e, address terminals 13, and a data input/output terminal 14. Although not shown in FIG. 1, the semiconductor device 10 also includes a data strobe terminal, a power source terminal or the like.

The clock terminals 11a and 11b are terminals to which external clocks CK and /CK are supplied, respectively. The supplied external clocks CK and /CK are supplied to a clock input circuit 21. The signal having a prefix "/" used in the present specification indicates an inverted signal of its corresponding signal. Therefore, the external signals CK and /CK are mutually complementary signals. The external signals CK and /CK received by the clock input circuit 21 are supplied to a DLL circuit 100. The DLL circuit 100 generates an internal clock LCLK that is phase-controlled based on the external signals CK and /CK, and supplies the internal clock LCLK to a data input/output circuit 80. Circuit configurations of the data input/output circuit 80 and the DLL circuit 100 are described later.

The command terminals 12a to 12e are terminals to which command signals CMD including a row address strobe signal /RAS, a column address strobe signal /CAS, a write enable signal /WE, a chip select signal /CS, and an on-die termination signal ODT are supplied, respectively. These command signals CMD are supplied to a command input circuit 31. The command signals CMD supplied to the command input circuit 31 are then supplied to a command decoder 32. The command decoder 32 is a circuit that generates and various internal commands ICMD including an ODT signal by maintaining, decoding, and counting the command signals. The generated internal commands ICMD are supplied to a row system control circuit 51, a column system control circuit 52, and a mode register 53. Except, the ODT signal is supplied to the data input/output circuit 80 and the DLL circuit 100. The ODT signal is a signal for having the data input/output circuit 80 function as a terminating resistor, which is supplied through the command terminal 12e. Although details are described later, an operation mode of the DLL circuit 100 is switched depending on whether the ODT signal is activated.

The address terminals 13 are terminals to which address signals ADD are supplied. The supplied address signals ADD are then supplied to an address input circuit 41. The output of the address input circuit 41 is supplied to an address latch circuit 42. From among the address signals ADD that are latched in the address latch circuit 42, a row address is supplied to the row system control circuit 51, and a column address is supplied to the column system control circuit 52. When there is an entry of mode register set, corresponding parts of the address signals ADD are supplied to the mode register 53, by which the contents of the mode register 53 are updated.

The output of the row system control circuit 51 is supplied to a row decoder 61. The row decoder 61 is a circuit that selects any one of word lines WL that are included in a memory cell array 70. In the memory cell array 70, a plurality of word lines WL and a plurality of bit lines BL intersect with each other, and a memory cell MC is located at each of the intersects (only a single word line WL, a single bit line BL, and a single memory cell MC are shown in FIG. 1). The bit line BL is connected to a corresponding sense amplifier SA in a sense circuit 63.

The output of the column system control circuit 52 is supplied to a column decoder 62. The column decoder 62 is a circuit that selects any one of the sense amplifiers SA included in the sense circuit 63. The sense amplifier SA selected by the column decoder 62 is connected to a data amplifier 64. At the time of a read operation, the data amplifier 64 further amplifies the read data that is amplified by the sense amplifier SA, and supplies the read data to the data input/output circuit 80 via a read/write bus RWBS. On the other hand, at the time of a write operation, the data amplifier 64 amplifies the write data that is supplied from the data input/output circuit 80 via the read/write bus RWBS, and supplies the write data to the sense amplifier SA.

The data input/output terminal 14 is a terminal for performing an output of the read data DQ and an input of the write data DQ, which is connected to the data input/output circuit 80. The internal clock LCLK is supplied to the data input/output circuit 80, and at the time of the read operation, the data input/output circuit 80 outputs the read data in synchronization with the internal clock LCLK. In addition, the ODT signal is also supplied to the data input/output circuit 80, and at the time of an ODT operation, the data input/output circuit 80 functions as the terminating resistor in synchronization with the internal clock LCLK.

Figure 2:
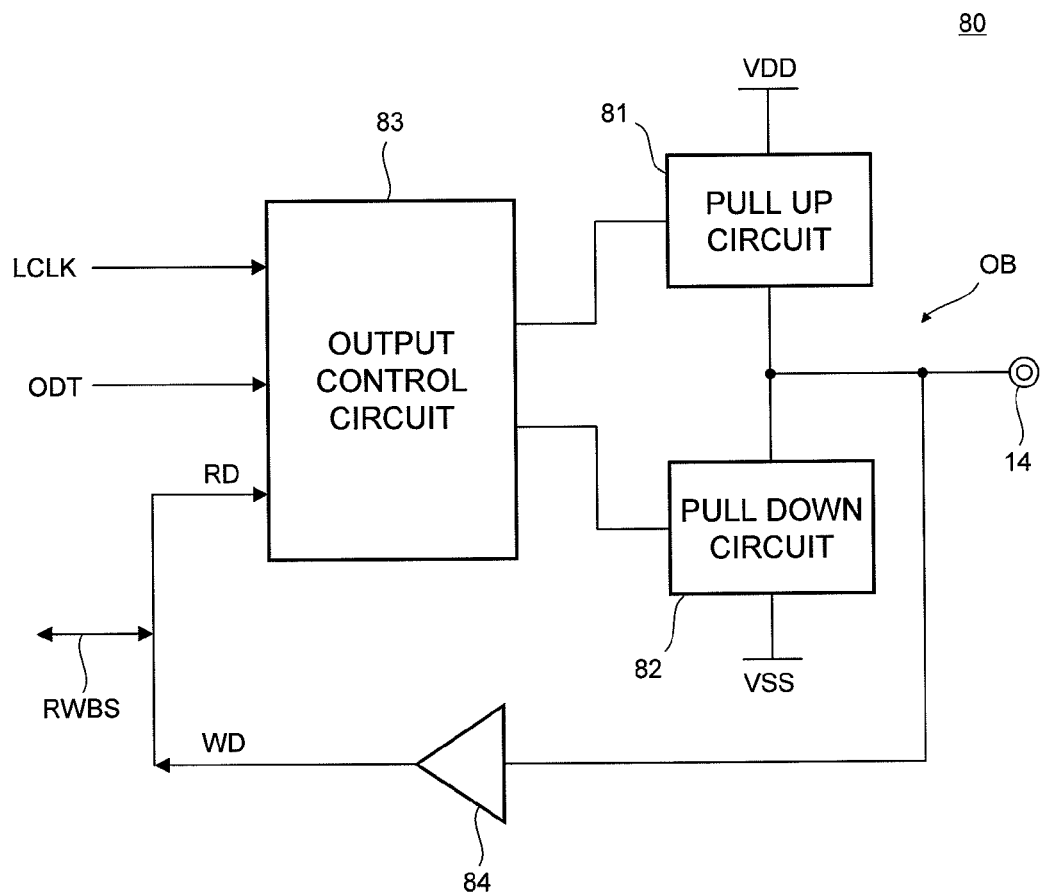
FIG. 2 is a circuit diagram of the data input/output circuit 80.

FIG. 2 is a circuit diagram of the data input/output circuit 80.

As shown in FIG. 2, the data input/output circuit 80 includes a pull up circuit 81, a pull down circuit 82, an output control circuit 83, and an input receiver 84. The pull up circuit 81 and the pull down circuit 82 are connected in series between the power sources VDD and VSS, forming an output buffer OB. The connection point of the pull up circuit 81 and the pull down circuit 82 is connected to the data input/output terminal 14. The pull up circuit 81 and the pull down circuit 82 not only form the output buffer OB but also function as a terminating resistor, of which the operation is controlled by the output control circuit 83.

Specifically, when internal read data RD that is supplied via the read/write bus RWBS indicates High level, the pull up circuit 81 is turned on and the pull down circuit 82 is turned off. The data input/output terminal 14 is then connected to the power source potential VDD, so that the read data DQ of High level is output. On the other hand, when the internal read data RD that is supplied via the read/write bus RWBS indicates Low level, the pull up circuit 81 is turned off and the pull down circuit 82 is turned on. The data input/output terminal 14 is then connected to the power source potential VSS, so that the read data DQ of Low level is output.

However, if the ODT signal is activated, both the pull up circuit 81 and the pull down circuit 82 are turned on. The pull up circuit 81 and the pull down circuit 82 then function as a terminating resistor, viewed from the data input/output terminal 14.

Operations of the pull up circuit 81 and the pull down circuit 82 are performed in synchronization with the internal clock LCLK that is supplied to the output control circuit 83. Therefore, the output timing of the read data and the operation timing of the ODT operation are determined in synchronization with the internal clock LCLK.

The write data DQ that is input via the data input/output terminal 14 is received by the input receiver 84. Write data WD received by the input receiver 84 is then supplied to the data amplifier 64 via the read/write bus RWBS.

Figure 3:
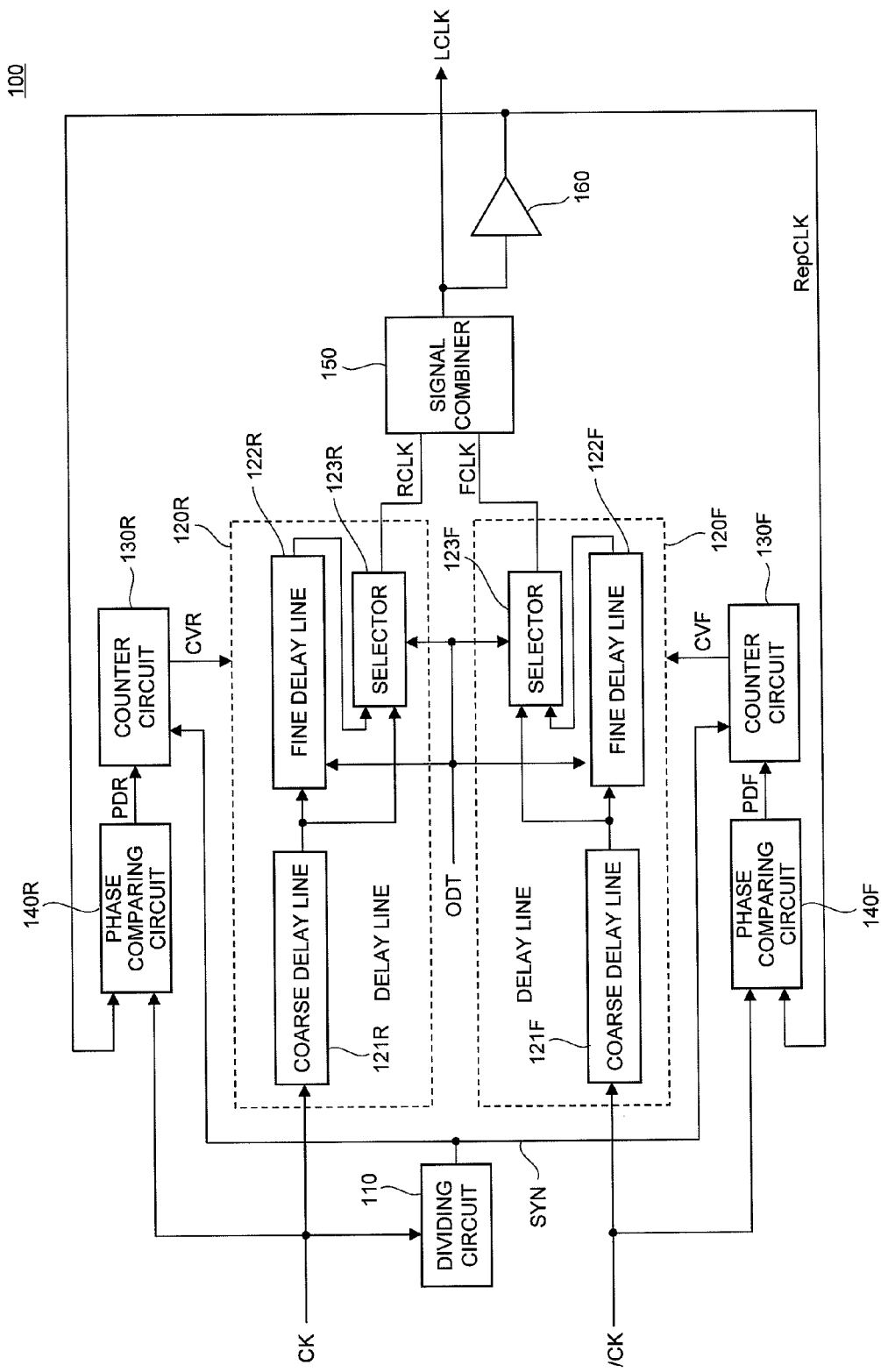
FIG. 3 is a circuit diagram of the DLL circuit 100 used in the first embodiment.

FIG. 3 is a circuit diagram of the DLL circuit 100.

As shown in FIG. 3, the DLL circuit 100 includes a dividing circuit 110, delay lines 120R and 120F, counter circuits 130R and 130F, phase comparing circuits 140R and 140F, and a signal combiner 150.

The dividing circuit 110 is a circuit that divides the output clock CK by M, where M is an integer, and generates a sampling clock SYN that is a divided clock. The sampling clock SYN is supplied to the counter circuits 130R and 130F and is used as a synchronization signal indicating an update timing of count values CVR and CVF. The reason for using the dividing circuit 110 is that, because it requires a predetermined time for updating the count values of the counter circuits 130R and 130F and changing the delay amounts of the delay lines 120R and 120F, it is troublesome to perform those operations for every cycle of the external clock CK. Furthermore, if the above operations are frequently performed more than necessary, power consumption is increased in a considerable amount. As an example, the integer M of the dividing circuit 110 for division is set to 16. In this case, the sampling clock SYN is activated for every 16 cycles of the external clock CK, and the update of the count values of the counter circuits 130R and 130F and the change of the delay amounts of the delay lines 120R and 120F are performed in synchronization with the sampling clock SYN.

The delay lines 120R and 120F are circuits that generate internal clocks RCLK and FOLK by delaying the external clocks CK and /CK, respectively. Specifically, the delay line 120R includes a coarse delay line 121R that delays the external clock CK with a relatively coarse adjustment pitch and a fine delay line 122R that delays the external clock CK with a relatively fine adjustment pitch. The signal passed through the delay lines 121R and 122R is used as the internal clock RCLK. The internal clock RCLK is a signal that is synchronized with a rising edge of the external clock CK (a falling edge of the external clock /CK). Similarly, the delay line 120F includes a coarse delay line 121F that delays the external clock /CK with a relatively coarse adjustment pitch and a fine delay line 122F that delays the external clock /CK with a relatively fine adjustment pitch. The signal passed through the delay lines 121F and 122F is used as the internal clock FOLK. The internal clock FOLK is a signal that is synchronized with a falling edge of the external clock CK (a rising edge of the external clock /CK).

The internal clocks RCLK and FOLK generated by the delay lines 120R and 120F are combined by the signal combiner 150. The combined signal is used as the internal clock LCLK. As shown in FIGS. 1 and 2, the internal clock LCLK is supplied to the data input/output circuit 80, and is used as a signal for defining an output timing of read data and an operation timing of the ODT operation.

As shown in FIG. 3, the internal clock LCLK is also supplied to a replica buffer 160. The replica buffer 160 is a circuit that has substantially the same circuit configuration as the output buffer OB shown in FIG. 2, and outputs a replica clock RepCLK in synchronization with the internal clock LCLK. Therefore, the phase of the replica clock RepCLK precisely matches with the phase of the read data DQ that is output from the data input/output terminal 14. However, the sizes of the transistors configuring the replica buffer 160 do not have to be the same as those of the transistors configuring the output buffer OB, but shrunk transistors of which the sizes are reduced can also be used as long as their impedances are substantially the same.

The counter circuits 130R and 130F are circuits that set the delay amounts of the delay lines 120R and 120F, respectively. The count values CVR and CVF of the counter circuits 130R and 130F are updated in synchronization with the sampling clock SYN. Increments or decrements of the count values CVR and CVF are determined based on phase determination signals PDR and PDF that are outputs of the phase comparing circuits 140R and 140F, respectively. That is, when the phase determination signals PDR and PDF indicate an up count, the counter circuits 130R and 130F counts up their count values CVR and CVF, respectively, in synchronization with the sampling clock SYN, by which the delay amounts of the delay lines 120R and 120F are increased. On the other hand, when the phase determination signals PDR and PDF indicate a down count, the counter circuits 130R and 130F counts down their count values CVR and CVF, respectively, in synchronization with the sampling clock SYN, by which the delay amounts of the delay lines 120R and 120F are decreased.

The phase comparing circuits 140R and 140F are circuits that detect phase differences between the external clocks CK and /CK and the replica clock RepCLK, respectively. As described above, the phase of the replica clock RepCLK is adjusted by the delay lines 120R and 120F to match with the phase of the read data DQ. However, the phases of the replica clock RepCLK and the read data DQ are changed from moment to moment due to changes in parameters influencing the delay amounts of the delay lines 120R and 120F such as a power-supply voltage or an environmental temperature, frequency fluctuations of the external clocks CK and /CK themselves or the like. The phase comparing circuits 140R and 140F detect such phase changes, and determine whether the replica clock RepCLK has a phase lead or a phase lag with respect to the external clocks CK and /CK. Determination of the phase lead or the phase lag is performed for every cycle of the external clocks CK and /CK, and the result of the determination is supplied to the counter circuits 130R and 130F as the phase determination signals PDR and PDF, respectively, by which the count values CVR and CVF are updated.

In the first embodiment, the delay lines 120R and 120F further include selectors 123R and 123F, respectively. The selector 123R is a circuit that selects either one of the output of the coarse delay line 121R and the output of the fine delay line 122R. Similarly, the selector 123F is a circuit that selects either one of the output of the coarse delay line 121F and the output of the fine delay line 122F. The selection of the delay line is performed based on the ODT signal, by which the operation mode of the DLL circuit 100 is switched over.

Specifically, in a first mode in which the ODT signal is not activated, the selectors 123R and 123F select the outputs of the fine delay lines 122R and 122F, respectively. Therefore, in the first mode in which the ODT signal is not activated, the internal clocks RCLK and FOLK are generated by being phase-controlled by both the coarse delay line and the fine delay line.

On the other hand, in a second mode in which the ODT signal is activated, the selectors 123R and 123F select the outputs of the coarse delay lines 121R and 121F, respectively. Therefore, in the second mode in which the ODT signal is activated, the internal clocks RCLK and FOLK are generated by being phase-controlled by the coarse delay line only.

As shown in FIG. 3, the ODT signal is also supplied to the fine delay lines 122R and 122F, so that the operations of the fine delay lines 122R and 122F are suspended with the activation of the ODT signal.

Figure 4:
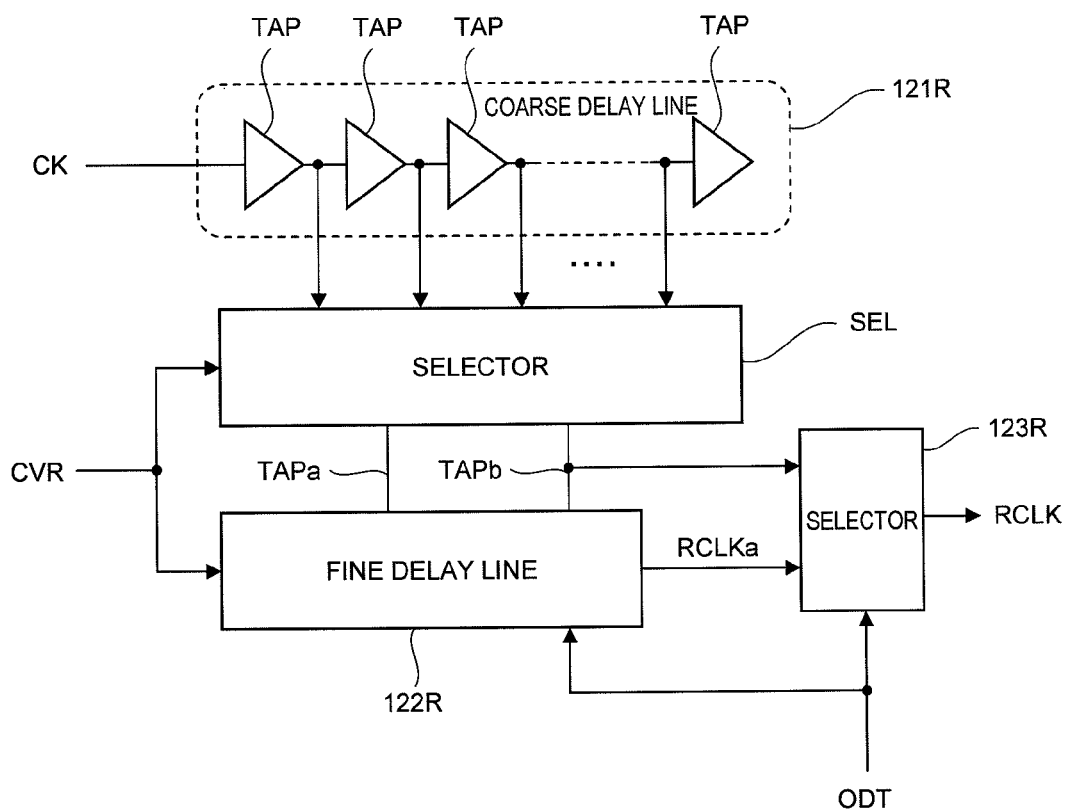
FIG. 4 is a detailed circuit diagram of the delay line 120R.

FIG. 4 is a detailed circuit diagram of the delay line 120R.

As shown in FIG. 4, the coarse delay line 121R is formed with a plurality of cascaded delay circuits TAP. The outputs of the delay circuits TAP are supplied to a selector SEL. The selector SEL receives the count value CVR from the counter circuit 130R, selects two outputs from among the outputs of the delay circuits TAP based on the count value CVR, and outputs the selected two outputs as selected clocks TAPa and TAPb. The selected clocks TAPa and TAPb are supplied to the fine delay line 122R. The two selected clocks TAPa and TAPb are the input signal and the output signal of the same delay circuit TAP. In other words, the phase difference between the selected two selected clocks TAPa and TAPb is equivalent to the adjustment pitch of the coarse delay line 121R.

The fine delay line 122R receives the selected clocks TAPa and TAPb, and generates an internal clock RCLKa that has a phase between the phase of the selected clock TAPa and the phase of the selected clock TAPb. The phase of the internal clock RCLKa is determined by the count value CVR of the counter circuit 130R.

The internal clock RCLKa and the selected clock TAPb are input to the selector 123R, either one of which is selected based on the ODT signal. Specifically, in the first mode in which the ODT signal is not activated, the selector 123R selects the internal clock RCLKa, and the internal clock RCLKa is output as the internal clock RCLK. On the other hand, in the second mode in which the ODT signal is activated, the selector 123R selects the selected clock TAPb, and the selected clock TAPb is output as the internal clock RCLK.

The ODT signal is further supplied to the fine delay line 122R, so that the operation of the fine delay line 122R is suspended with the activation of the ODT signal. At the time when the ODT signal is activated, the selected clock TAPb is selected by the selector 123R, so that the fine delay line 122R does not need to perform its operation.

While the circuit configuration and the operation of the delay line 120R have been explained above, the circuit configuration and the operation of the delay line 120F are similar to those of the delay line 120R. Therefore, redundant explanations thereof will be omitted.

The operation of the semiconductor device 10 according to the first embodiment is explained next.

First, a case that the ODT signal that is supplied to the command terminal 12e is not activated is explained. In this case, the ODT signal is not activated, and the data input/output circuit 80 performs a read operation or a write operation in response to the command. For example, in the case of performing the read operation, either one of the pull up circuit 81 and the pull down circuit 82 that form the output buffer OB is turned on, by which the read data of the High level or the Low level is output via the data input/output terminal 14. The output timing of the read data is controlled based on the internal clock LCLK that is supplied to the output control circuit 83.

At this time, the DLL circuit 100 performs the operation in the first mode, so that a fine adjustment of the internal clock LCLK is performed by the fine delay lines 122R and 122F. Therefore, the phase of the read data matches with the phases of the output clocks CK and /CK in a precise manner.

On the other hand, in a case that the ODT signal that is supplied to the command terminal 12e is activated, the data input/output circuit 80 performs the ODT operation. That is, in the ODT operation, both the pull up circuit 81 and the pull down circuit 82 that form the output buffer OB are turned on, and the output buffer OB functions as a terminating resistor. In the ODT operation, the on timing and off timing of the pull up circuit 81 and the pull down circuit 82 are controlled based on the internal clock LCLK that is supplied to the output control circuit 83.

At this time, the DLL circuit performs the operation in the second mode, and because the fine delay lines 122R and 122F are bypassed, there is a possibility that the operation timing of the ODT operation is slightly deviated from the phases of the external clocks CK and /CK. However, the operation timing of the ODT operation does not need to be controlled so precisely as the output timing of the read data, and a large margin of the operation timing is also defined in the specifications compared to the read operation, so that it does not cause any practical problem. Instead, the suspension of the fine delay lines 122R and 122F contributes to reduction of the power consumption of the DLL circuit 100, which makes it possible to suppress the power consumption of the entire semiconductor device.

As described above, in the first embodiment, the DLL circuit 100 has two operation modes. In the first mode in which the ODT signal is not activated, the internal clock is phase-controlled in a highly precise manner by operation both the coarse delay line and the fine delay line. On the other hand, in the second mode in which the ODT signal is activated, the DLL circuit 100 operates with low power consumption by operating the coarse delay line while suspending the operation of the fine delay line. With this configuration, the power consumption at the ODT operation can be reduced while controlling the phase of the read data the read operation in a highly precise manner.

A second embodiment of the present invention is explained next.

Figure 5:
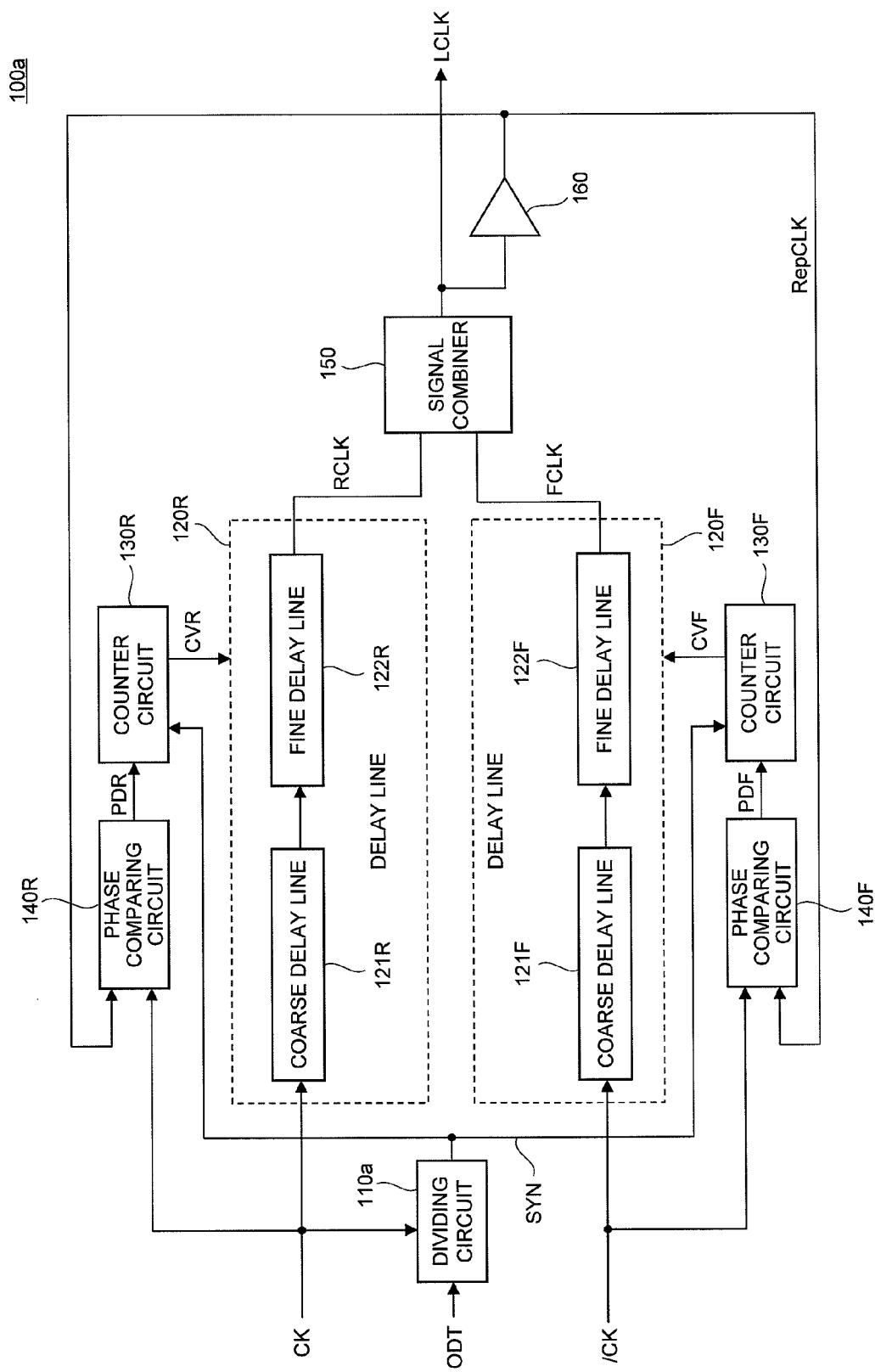
FIG. 5 is a circuit diagram of a DLL circuit 100a used in the second embodiment.

FIG. 5 is a circuit diagram of a DLL circuit 100a used in the second embodiment.

As shown in FIG. 5, the DLL circuit 100a used in the second embodiment is different from the DLL circuit 100 shown in FIG. 3 in that the dividing circuit 110 is replaced with a dividing circuit 110a and the selectors 123R and 123F are removed from the delay lines 120R and 120F. In addition, the operations of the fine delay lines 122R and 122F are not suspended by the ODT signal. Other features of the DLL circuit 100a are the same as those of the DLL circuit 100 shown in FIG. 3, and thus like constituent elements are denoted by like reference numerals and redundant explanations thereof will be omitted.

The dividing circuit 110a changes the frequency of the sampling clock SYN, which is a divided clock, depending on the activation state of the ODT signal. Specifically, in the first mode in which the ODT signal is not activated, the dividing circuit 110a generates the sampling clock SYN by dividing the external clock CK by M, and in the second mode in which the ODT signal is activated, the dividing circuit 110a generates the sampling clock SYN by dividing the external signal CK by N (where N>M).

While the values M and N are not particularly limited as long as the relation N>M is satisfied, it is preferable to set the ratio N/M to about 4. For example, if M=16, the value N can be set as N=64. In this case, the sampling clock SYN is activated for every 16 cycles of the external clock CK in the first mode, and the sampling clock SYN is activated for every 64 cycles of the external clock CK in the second mode. Therefore, in the second mode, the frequency of updating the count values of the counter circuits 130R and 130F and changing the delay amounts of the delay lines 120R and 120F is lower than in the first mode.

Accordingly, in the second mode, the precision of the phase follow-up of the internal clock LCLK with respect to the external clocks CK and /CK decreases. However, as described above, the operation timing of the ODT operation does not need to be controlled so precisely as the output timing of the read data, so that it does not cause any practical problem. Instead, the decrease of the frequency of the sampling clock SYN contributes to the reduction of the power consumption of the DLL circuit 100a, which makes it possible to suppress the power consumption of the entire semiconductor device.

A third embodiment of the present invention is explained next.

Figure 6:
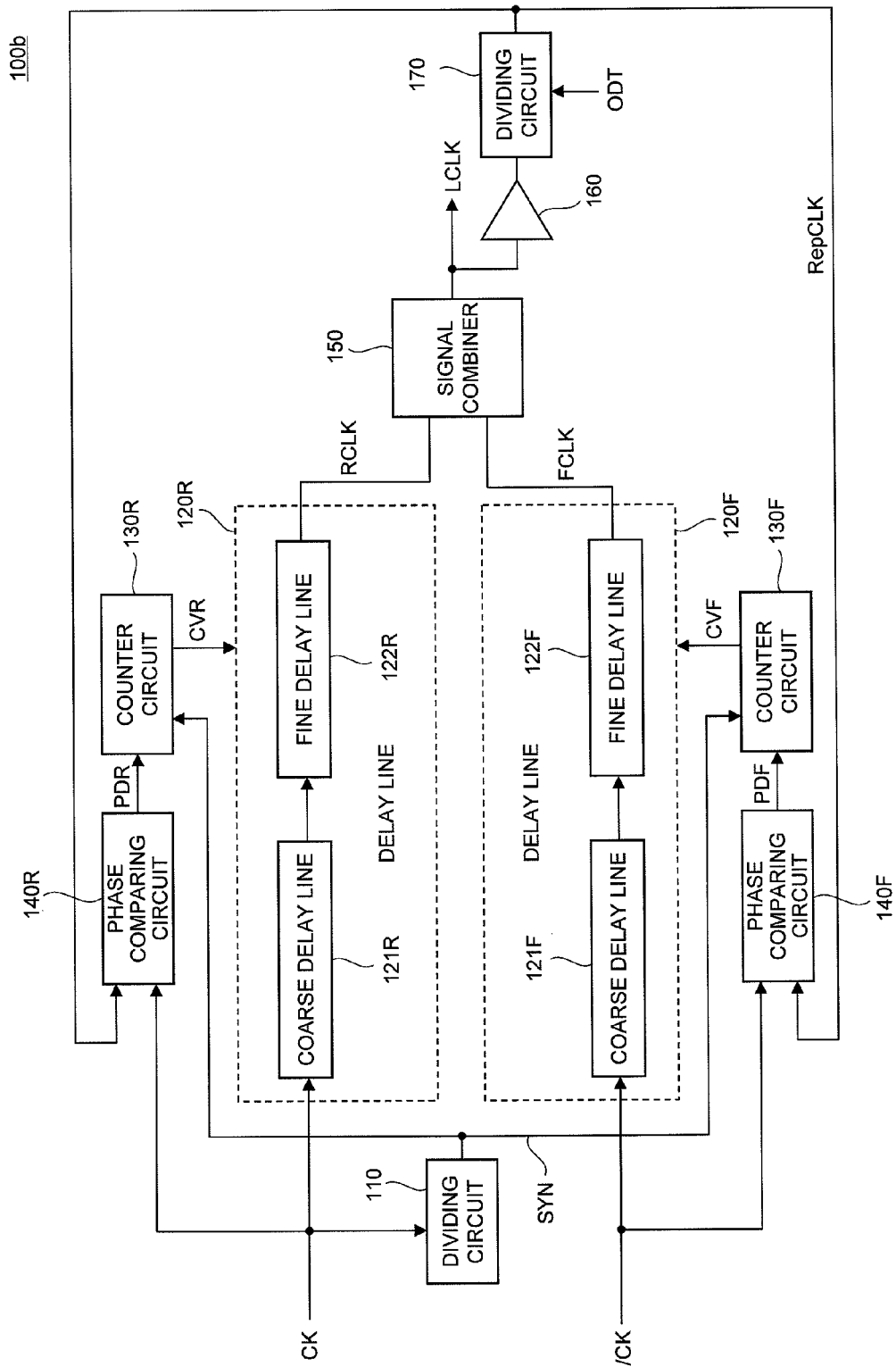
FIG. 6 is a circuit diagram of a DLL circuit 100b used in the third embodiment.

FIG. 6 is a circuit diagram of a DLL circuit 100b used in the third embodiment.

As shown in FIG. 6, the DLL circuit 100b used in the third embodiment is different from the DLL circuit 100 shown in FIG. 3 in that a dividing circuit 170 is provided after the replica buffer 160 and the selectors 123R and 123F are removed from the delay lines 120R and 120F. In addition, the operations of the fine delay lines 122R and 122F are not suspended by the ODT signal. Other features of the DLL circuit 100b are the same as those of the DLL circuit 100 shown in FIG. 3, and thus like constituent elements are denoted by like reference numerals and redundant explanations thereof will be omitted.

The dividing circuit 170 divides the replica clock RepCLK, which is the output of the replica buffer 160, based on the ODT signal. Specifically, in the first mode in which the ODT signal is not activated, the dividing circuit 170 outputs the replica clock RepCLK as it is without dividing the output of the replica buffer 160, and in the second mode in which the ODT signal is activated, the dividing circuit 170 divides the output of the replica buffer 160 by K, and outputs the divided clock as the replica clock RepCLK.

While the value K, which is the dividing factor, is not particularly limited, it is preferable to set K to a value equal to or larger than M, which is the dividing factor of the dividing circuit 110 and set the ratio K/M to about 4. For example, if M=16, the value K can be set as K=64. In this case, because the frequency of the external clocks CK and /CK are the same as that of the replica clock RepCLK in the first mode, the phase comparing circuits 140R and 140F perform the phase comparison for every cycle of the external clocks CK and /CK. On the other hand, in the second mode, because the frequency of the replica clock RepCLK becomes 1/64 of the frequency of the external clocks CK and /CK, the phase comparing circuits 140R and 140F perform the phase comparison for every 64 cycles of the external clocks CK and /CK.

Accordingly, in the second mode, the precision of the phase follow-up of the internal clock LCLK with respect to the external clocks CK and /CK decreases. However, as described above, the operation timing of the ODT operation does not need to be controlled so precisely as the output timing of the read data, so that it does not cause any practical problem. Instead, the decrease of the frequency of the replica clock RepCLK contributes to the reduction of the power consumption of the DLL circuit 100b, which makes it possible to suppress the power consumption of the entire semiconductor device.

In the first to third embodiments described above, the operations in the first mode do not differ from each other, while the operations in the second mode differ from each other. That is, when the operation mode is switched to the second mode, the fine delay lines are suspended in the first embodiment, the frequency of the sampling clock SYN is decreased in the second embodiment, and the frequency of the replica clock RepCLK is decreased in the third embodiment. However, it does not mean that energy saving operations in the second mode are respectively applicable in a separate manner, but two or more energy saving operations can be used in combination.

Figure 7:
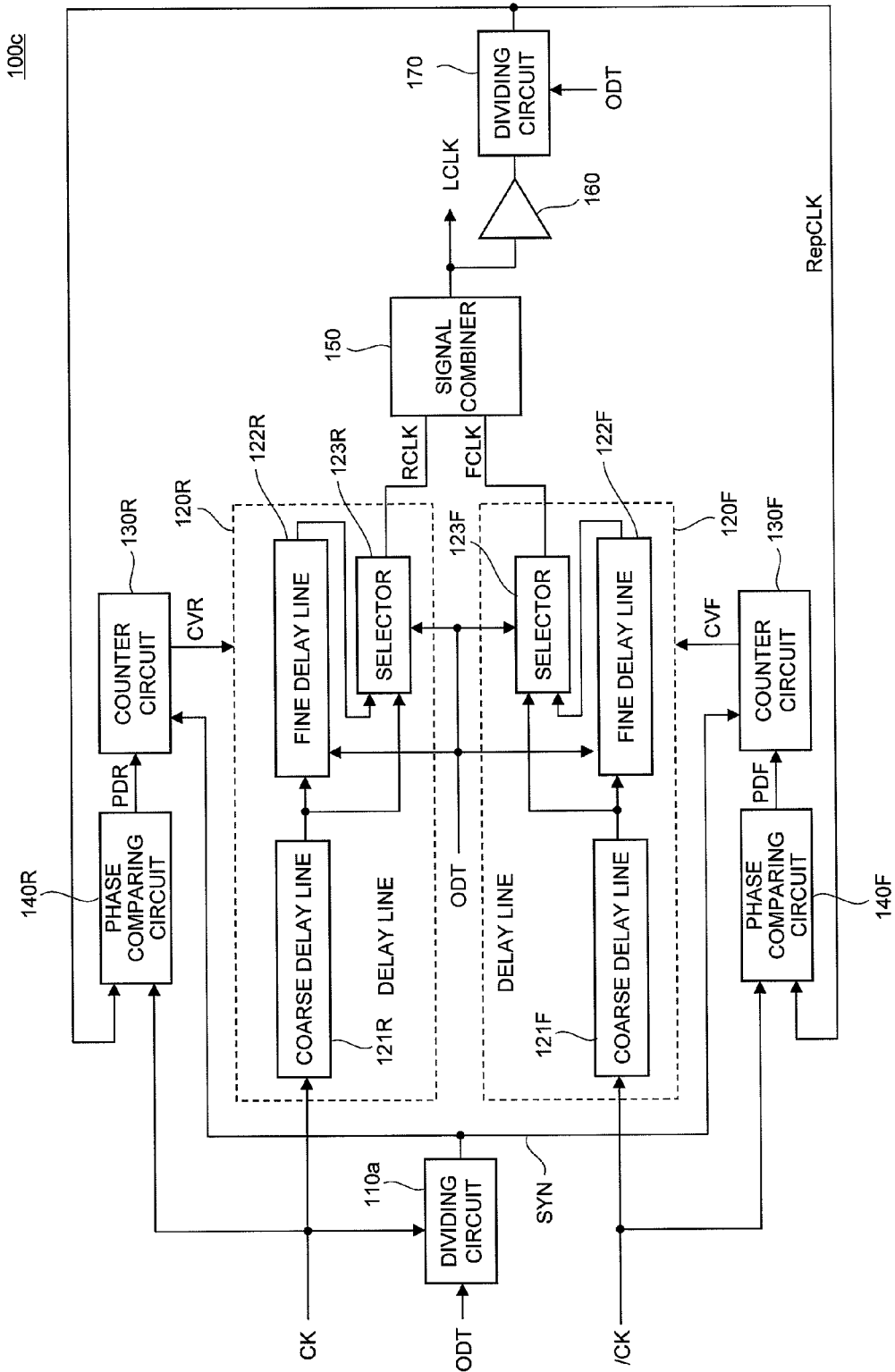
FIG. 7 is a circuit diagram of a DLL circuit 100c used in the fourth embodiment.

FIG. 7 is a circuit diagram of a DLL circuit 100c according to a fourth embodiment of the present invention, and shows an example to which all of the energy saving operations according to the first to third embodiments are applied.

The operation of the DLL circuit 100c shown in FIG. 7 in the first mode is the same as that in the first to third embodiments. However, in the second mode in which the ODT signal is activated, the operations of the fine delay lines 122R and 122F are suspended, the frequency of the sampling clock SYN is decreased by the dividing circuit 110a, and the frequency of the replica clock RepCLK is decreased by the dividing circuit 170. With this configuration, the power consumption of the DLL circuit 100c can be significantly reduced.

Reduction of the power consumption is explained with specific figures. When the frequency of the external clocks CK and /CK is 800 MHz, typical power consumption of the DLL circuit 100c in the first mode is about 3 mW for the DLL circuit excluding the fine delay lines, about 1 mW for the fine delay lines, and about 1 mW for the replica buffer. Therefore, the total power of 5 mW is consumed.

On the other hand, in the second mode, the power consumption of the DLL circuit excluding the fine delay lines is suppressed to about 0.75 mW owing to the decrease of the frequency of the sampling clock SYN. Furthermore, the power consumption of the fine delay lines becomes zero owing to the suspension of the fine delay lines. In addition, the power consumption of the replica buffer is suppressed to about 0.02 mW owing to the decrease of the frequency of the replica clock RepCLK. Accordingly, the total power consumption becomes about 0.77 mW, which achieves about 85% reduction of the power consumption.

A modified configuration of the first embodiment is explained next.

Figure 8:
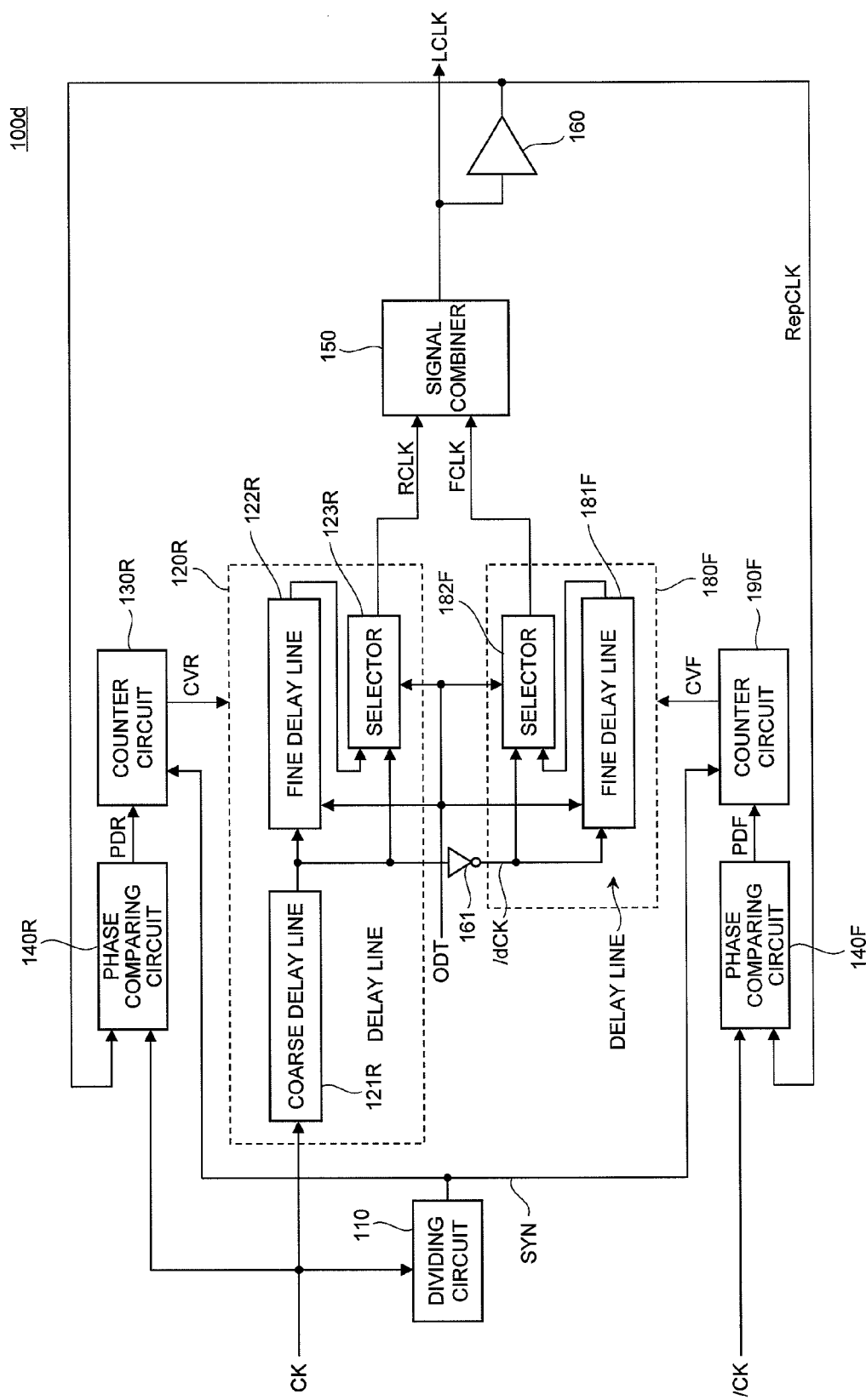
FIG. 8 is a circuit diagram of a DLL circuit 100d that is a modified configuration of the first embodiment shown in FIG. 3.

FIG. 8 is a circuit diagram of a DLL circuit 100d that is a modified configuration of the first embodiment shown in FIG. 3.

As shown in FIG. 8, the DLL circuit 100d is different from the DLL circuit 100 shown in FIG. 3 in that the delay line 120F is replaced with a delay line 180F and an inverter 161 is added. Other features of the DLL circuit 100d are the same as those of the DLL circuit 100 shown in FIG. 3, and thus like constituent elements are denoted by like reference numerals and redundant explanations thereof will be omitted.

The inverter 161 inverts a delayed external clock CK delayed by the coarse delay line 121R included in the delay line 120R to generate an inverted delayed clock /dCK. The inverted delayed clock /dCK is supplied to the delay line 180F.

The delay line 180F generates the internal clock FOLK by delaying the inverted delayed clock /dCK. Specifically, the delay line 180F is different from the delay line 120F in that the coarse delay line 121F shown in FIG. 3 is omitted. The delay line 180F includes a fine delay line 181F that delays the inverted delayed clock /dCK with a relatively fine adjustment pitch with respect to the coarse delay line 121R. An output signal of the delay line 180F is used as the internal clock FOLK. The internal clock FOLK is a signal that is synchronized with a falling edge of the external clock CK.

The delay line 180F includes a selector 182F. The selector 182F is a circuit that selects either one of the inverted delayed clock /dCK and the output signal of the fine delay line 181F. The operation of the selector 182F is controlled by the ODT signal. That is, the operation of the selector 182F is substantially the same as that of the selector 123F shown in FIG. 3.

As described the above, in this modified embodiment, the internal clock FOLK is generated based on the inverted delayed clock /dCK that is a delayed signal of the output of the coarse delay line 121R. This enables a coarse delay line to be omitted from the delay line 180F. Therefore, an occupied area of the DLL circuit 100d can be reduced relative to the DLL circuit 100 shown in FIG. 3.

The modified configuration described above can be applied to not only the first embodiment (DLL circuit 100) but also the second embodiment (DLL circuit 100a), the third embodiment (DLL circuit 100b), and the third embodiment (DLL circuit 100c) so as to reduce the occupied area.

It is worth noting that the DLL circuits 100, 100a, 100b, 100c and 100d are only some examples of a DLL circuit employed in the semiconductor device of the present invention. Thus, a specific configuration of a DLL circuit employed in the semiconductor device of the present invention is not limited to these DLL circuits 100, 100a, 100b, 100c and 100d. For example, a circuit configuration of the DLL circuit 100 of the first embodiment is one example of a DLL circuit employing a coarse delay line having a relatively large adjustment pitch for adjusting a delay amount and a fine delay line having a relatively small adjustment pitch for adjusting the delay amount. Therefore, when the present invention is applied to a DLL circuit having a coarse delay line and a fine delay line, the scope of the present invention is not limited to the respective features of the DLL circuit 100. Similarly, a circuit configuration of the DLL circuit 100a of the second embodiment is one example of a DLL circuit employing a counter circuit. Therefore, when the present invention is applied to a DLL circuit having a counter circuit, the scope of the present invention is not limited to the respective features of the DLL circuit 100a. Furthermore, a circuit configuration of the DLL circuit 100c of the third embodiment is one example of a DLL circuit employing a phase comparing circuit. Therefore, when the present invention is applied to a DLL circuit having a phase comparing circuit, the scope of the present invention is not limited to the respective features of the DLL circuit 100b.

It is apparent that the present invention is not limited to the above embodiments, but may be modified and changed without departing from the scope and spirit of the invention.

As an example, a synchronous memory including a DLL circuit has been explained in the first to fourth embodiments. However, the clock generating circuit according to the present invention does not necessarily have to be a DLL circuit. Therefore, as long as a circuit is for generating an internal clock for determining an operation timing of a data input/output circuit, the circuit of the present invention can be any clock generating circuit other than a DLL circuit. Furthermore, the semiconductor device according to the present invention does not necessarily have to be a synchronous memory.

What is claimed is:

1. A device comprising:
   an input/output terminal;
   an input/output circuit coupled to the input/output terminal and receiving an On Die Termination (ODT) signal, the input/output circuit performing an ODT operation when the ODT signal is activated; and
   a clock generating circuit receiving a first clock signal and outputting an internal clock signal in response to the first clock signal, the internal clock signal being substantially equal in frequency to the first clock signal, the clock generating circuit comprising a coarse delay line, a fine delay line and a selector circuit, the coarse delay line being greater in adjustment pitch than the fine delay line,
   the coarse delay line comprising:
   a first input node, which receives the first clock signal; and
   a first output node connected to the fine delay line and the selector,
   the fine delay line comprising:
   a second input node connected to the first output node of the coarse delay line; and
   a second output node connected to the selector,
   the selector circuit comprising:
   a third input node coupled to the first output node;
   a fourth input node coupled to the second output node;
   a fifth input node which receives the ODT signal; and
   a third output node, which outputs the internal clock,
   wherein the selector circuit receives the ODT signal and connects the third input node to the third output node when the ODT signal is activated and connects the fourth input node to the third output node when the ODT signal is not activated.

2. The device as claimed in claim 1, wherein the clock generating circuit includes a Delay Locked Loop (DLL) circuit.

3. The device as claimed in claim 1, wherein the fine delay line, which receives the ODT signal, is deactivated when the ODT signal is activated and is activated when the ODT is not activated.

* * * * *